(12) United States Patent
Vogelsang

(10) Patent No.: US 9,111,588 B2
(45) Date of Patent: Aug. 18, 2015

(54) MULTI-DIE DRAM BANKS ARRANGEMENT AND WIRING

(75) Inventor: Thomas Vogelsang, Mountain View, CA (US)

(73) Assignee: RAMBUS INC., Sunnyvale, CA (US)

( * ) Notice: Subject to any disclaimer, the term of this patent is extended or adjusted under 35 U.S.C. 154(b) by 130 days.

(21) Appl. No.: 13/885,225

(22) PCT Filed: Dec. 7, 2011

(86) PCT No.: PCT/US2011/063657
§ 371 (c)(1),
(2), (4) Date: May 14, 2013

(87) PCT Pub. No.: WO2012/082480
PCT Pub. Date: Jun. 21, 2012

(65) Prior Publication Data
US 2013/0229848 A1    Sep. 5, 2013

Related U.S. Application Data

(60) Provisional application No. 61/423,043, filed on Dec. 14, 2010.

(51) Int. Cl.
*G11C 5/00* (2006.01)
*G11C 5/06* (2006.01)
*G11C 5/02* (2006.01)
*G11C 8/12* (2006.01)

(52) U.S. Cl.
CPC ............. *G11C 5/06* (2013.01); *G11C 5/025* (2013.01); *G11C 5/063* (2013.01); *G11C 8/12* (2013.01)

(58) Field of Classification Search
CPC .......... G11C 5/025; G11C 5/06; G11C 5/063; G11C 8/12
USPC ............ 365/63; 257/723, 686, E25.013, 773, 257/774, 777; 711/100
See application file for complete search history.

(56) References Cited

U.S. PATENT DOCUMENTS

| | | | |
|---|---|---|---|
| 2007/0064515 A1* | 3/2007 | Choi | ......................... 365/230.05 |
| 2007/0143677 A1 | 6/2007 | Pyeon et al. | |
| 2009/0040861 A1 | 2/2009 | Ruckerbauer | |
| 2009/0103345 A1 | 4/2009 | McLaren et al. | |
| 2009/0161401 A1 | 6/2009 | Bilger et al. | |

(Continued)

OTHER PUBLICATIONS

International Search Report and Written Opinion, dated Jun. 22, 2012 in International Application No. PCT/US2011/063657. 12 pages.

(Continued)

*Primary Examiner* — Richard Elms
*Assistant Examiner* — Xiaochun L Chen
(74) *Attorney, Agent, or Firm* — Morgan, Lewis & Bockius LLP

(57) ABSTRACT

A memory die for use in a multi-die stack having at least one other die. The memory die includes a plurality of contacts arranged in a field and configured to interface to the other dies of the multi-die stack. A first subset of the buffer lines of a number of buffer lines are connected to respective contacts in the field. The memory die also includes a number of buffers and cross-bar lines. The buffers are coupled between respective signal lines and respective buffer lines. The cross-bar lines interconnect respective pairs of buffer lines in a second subset of the buffer lines that is distinct from the first subset of the buffer lines.

21 Claims, 8 Drawing Sheets

(56) References Cited

U.S. PATENT DOCUMENTS

| | | | |
|---|---|---|---|
| 2009/0319703 A1* | 12/2009 | Chung | 710/52 |
| 2009/0321893 A1 | 12/2009 | Somasekhar et al. | |
| 2010/0020583 A1 | 1/2010 | Kang et al. | |
| 2010/0195364 A1 | 8/2010 | Riho | |

OTHER PUBLICATIONS

Rambus Inc., International Search Report and Written Opinion, PCT/US2011/063657, Jun. 22, 2012, 11 pgs.

* cited by examiner

US 9,111,588 B2

MULTI-DIE DRAM BANKS ARRANGEMENT AND WIRING

CROSS REFERENCE TO RELATED APPLICATIONS

This Application is a United States National Stage Application filed under 35 U.S.C. §371 of PCT Patent Application Ser. No. PCT/US2011/063657 filed on Dec. 7, 2011, which claims the benefit of and priority to U.S. Provisional Patent Application No. 61/423,043 filed on Dec. 14, 2010, both of which are hereby incorporated by reference in their entireties.

TECHNICAL FIELD

The disclosed embodiments relate generally to dynamic random access memory (DRAM) and more specifically to arrangement and wiring of memory banks in multi-die DRAM.

BACKGROUND

Higher density electronic chips can be achieved by specialized electronic packages where multiple integrated circuits (ICs) are packaged into a multi-chip module (MCM). Recent MCM technologies allow multiple semiconductor dies to be packaged as a vertical stack (i.e., a multi-die stack or a multi-chip stack) formed on a substrate. The dies in multi-die stack may include electronic circuitry such as memory banks (e.g., dynamic random access memory (DRAM)), memory controllers, central processing unit (CPU), etc. The dies in the multi-die stack can be interconnected by various forms of contacts such as through-silicon vias (TSVs) or solder bumps. Configuring electronic circuits and providing connections from the electronic circuits to interconnect contacts (e.g., TSVs or solder bumps) on a die in the multi-die stack becomes more challenging as the density of contacts on the die increases (e.g., due to enhanced complexity of the electronic circuits and/or reduced minimum feature size). Moreover, the efficiency and speed of existing multi-die stacks is reduced by configurations of electronic circuits that include large numbers of contacts and extensive circuitry.

SUMMARY

Accordingly, there is a need for configurations of electronic circuits that reduce the number of contacts and/or reduce the circuitry needed to couple memory banks to the contacts, thereby increasing the speed and efficiency of the multi-die stack. The embodiments disclosed herein reduce the number of contacts and/or the circuitry needed to couple memory banks to contacts in a multi-die stack through the user of buffers which dynamically select contacts to be connected to a currently selected memory bank, thereby improving the performance characteristics of the multi-die stack as described in greater detail below.

In accordance with some embodiments, a memory die for use in a multi-die stack having at least one other die includes: a plurality of memory banks, each having a plurality of signal lines; a plurality of contacts arranged in a field, the contacts configured to interface to the other die of the multi-die stack. The memory die further includes buffer lines, a first subset of the buffer lines connected to respective contacts in the field; a plurality of buffers each coupled between a respective signal line and a respective buffer line; and a plurality of cross-bar lines interconnecting respective pairs of buffer lines in a second subset of the buffer lines that is distinct from the first subset of the buffer lines.

In accordance with some embodiments, a memory die includes: a plurality of memory banks, each having a plurality of signal lines; and a plurality of contacts arranged in a field, the contacts configured to interface to another die of a multi-die stack. The memory die also includes a plurality of buffers to couple each of the plurality of signal lines of a respective memory bank to a respective contact in the field. During a respective operation of the memory die, a first subset of the plurality of buffers is configured to be in the first state and a second subset of the plurality of buffers is configured to be in the second state.

In accordance with some embodiments, a memory die, includes: a plurality of memory banks, each having a plurality of signal lines, each signal line coupled to a respective contact of a plurality of contacts arranged in a field, the contact configured to interface to another die of a multi-die stack. The memory die also includes a plurality of buffers to selectively couple signal lines of a respective memory bank to a plurality of buffer lines. Half the buffers are configured, in a first state, to couple a first half of the signal lines through a first half of the buffer lines to a first half of the contacts, and the other half of the buffers are configured, in a second state, to couple a second half of the signal lines through a second half of the buffer lines to a second half of the contacts.

Thus, a memory die with improved performance characteristics (e.g., efficiency, speed, etc.) is described herein.

BRIEF DESCRIPTION OF THE DRAWINGS

For a better understanding of the aforementioned embodiments of the invention as well as additional embodiments thereof, reference should be made to the Description of Embodiments below, in conjunction with the following drawings in which like reference numerals refer to corresponding parts throughout the figures.

DESCRIPTION OF EMBODIMENTS

Memory die component and wiring arrangements are described herein. Reference will be made to certain embodiments of the invention, examples of which are illustrated in the accompanying drawings. While the invention will be described in conjunction with particular embodiments, it will be understood that it is not intended to limit the invention to these particular embodiments. On the contrary, the invention is intended to cover alternatives, modifications and equivalents that are within the spirit and scope of the invention. The specification and drawings are, accordingly, to be regarded in an illustrative rather than a restrictive sense.

Moreover, in the following description, numerous specific details are set forth to provide a thorough understanding of the present invention. However, it will be apparent to one of ordinary skill in the art that the invention can be practiced without these particular details. In other instances, methods, components, and elements that are well known to those of ordinary skill in the art are not described in detail to avoid obscuring aspects of the present invention.

It will also be understood that, although the terms first, second, etc. may be used herein to describe various elements, these elements should not be limited by these terms. These terms are only used to distinguish one element from another. For example, a first memory bank could be termed a second memory bank, and, similarly, a second memory bank could be termed a first memory bank, without departing from the scope of the present invention. The first memory bank and the second memory bank are both memory banks, but they are not the same memory bank.

The terminology used in the description of the invention herein is for the purpose of describing particular embodiments only and is not intended to be limiting of the invention. As used in the description of the invention and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, operations, elements, and/or components, but do not preclude the presence or addition of one or more other features, operations, elements, components, and/or groups thereof.

Unless specifically disclosed herein as having a different meaning, the term "substantially parallel" means within five degrees of being parallel, the term "substantially all" means "at least 90% of the items in question, and "substantially the same value" means differing in value by no more than ten percent.

Figure 1:
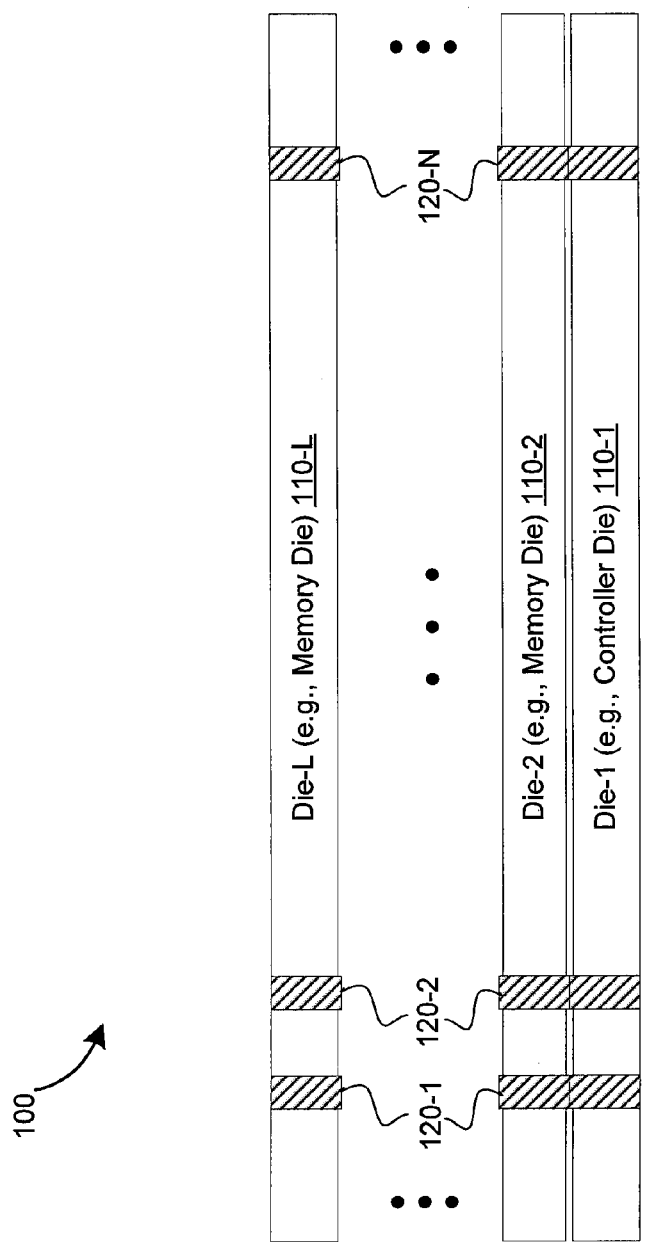
FIG. 1 is a diagram illustrating a multi-die stack, in accordance with some embodiments.

FIG. 1 is a diagram illustrating a multi-die stack 100, according to some embodiments. Multi-die stack 100 includes a number of dies 110-1 to 110-L (e.g. semiconductor dies or chips including integrated circuits). One or more of the dies of multi-die stack 100 (e.g., die 110-1) may be a control die that includes control circuitry (e.g., microprocessor, memory controller, etc.) for controlling at least some of the operations of the memory circuits. For example, the control die may specify locations (e.g., locations associated with particular words, bytes, or bits) in the memory dies to be read, erased, programmed, etc. As another example, the control die may also generate control signals (e.g., bank address bits in the control signal) which are used by the other dies to determine which memory banks are to be selected for connection to a field of contacts that connects to controller die 110-1. While controller die 110-1 is shown as the bottom layer of the multi-die stack, it should be understood that the controller die could be located at any layer of the multi-die stack. Similarly, it should also be understood that the multi-die stack could alternatively include multiple controller dies or no controller dies, or the functions of the controller die could be distributed throughout two or more dies of the multi-die stack.

As shown in FIG. 1, one or more of the dies 110 of multi-die stack 100 include memory (e.g., DRAM or other types of memory) circuits. Multi-die stack 100 includes L dies, including one or more controller dies and one or more memory dies. In the illustrated embodiment, the bottom die 110-1 is a controller die which is responsible for controlling the operation of a plurality of memory dies (e.g., 110-2 to 110-L) that are located above controller die 110-1. Typically, one or more of the memory dies (e.g., 110-2 to 110-L) includes sense amplifiers, which amplify data read from memory banks of the memory die. The sense amplifiers, located in the memory die, are positioned in the data signal paths between the memory banks of the memory die and signal lines that convey data signals between the memory die and an input/output (110) interface of controller die 110-1.

Memory banks (e.g., DRAM or SRAM memory banks) of the memory dies (e.g., 110-2 to 110-L) are connected to controller die 110-1 through respective contacts 120. In some embodiments, dies 110 are interconnected through a plurality of contacts 120-1 to 120-N, which enable signals to pass between dies in the multi-die stack. One having ordinary skill in the art would readily appreciate that contacts 120 may be implemented using various methods. In some embodiments, contacts 120 include a number of through-silicon vias (TSVs) forming a TSV field. The contacts are not, however, limited to TSVs. In some embodiments, contacts 120 are solder bumps. For example, in a flip-chip configuration, the contacts may take the form of solder microbumps. As discussed in greater detail below, in some embodiments, contacts 120 are used to selectively connect the memory banks of the memory dies (e.g., 110-2 to 110-L) to controller die 110-1 in accordance with control signals (e.g., signals including bank address bits) from controller die 110-1.

Typically, as shown in FIGS. 2-4C and 5, contacts 120 are arranged in a field of contacts 202 containing many (e.g., hundreds, or more) contacts. However, other arrangements of the contacts are possible, as would readily be appreciated by one having ordinary skill in the art. A respective contact 120 typically has a keep-out area due to, for example, mechanical stress created by the respective contact, which is of a different material from silicon, or by an electrical field from the contact influencing the silicon around it. The electric field can be generated by the contact while signals are being transferred through the contact. Typically, this keep-out area is approximately one to two times the diameter of the contact. However it should be understood that the size of the keep-out area will vary depending on the composition of the contact and the memory die as well as the magnitude of the electrical currents flowing through the contacts.

The keep-out area imposes a limit on the density of the contacts and other active circuit components in the field of contacts. To address this problem, in some of the embodiments described in greater detail below, active circuit components are arranged and interconnected such that all or substantially all of the active circuit components are located outside of the field of contacts. In some embodiments which use Cu TSV as contacts, the mechanical stress created by the different thermal expansion coefficients of Cu and Si changes active device properties significantly when they are close to the TSVs. Having all active devices outside of the contact (in this embodiment) TSV field allows placing the TSVs close together allowing for a relatively small and compact TSV field, reducing the chip real estate needed and making the multi-die stack more cost efficient.

Figure 2:
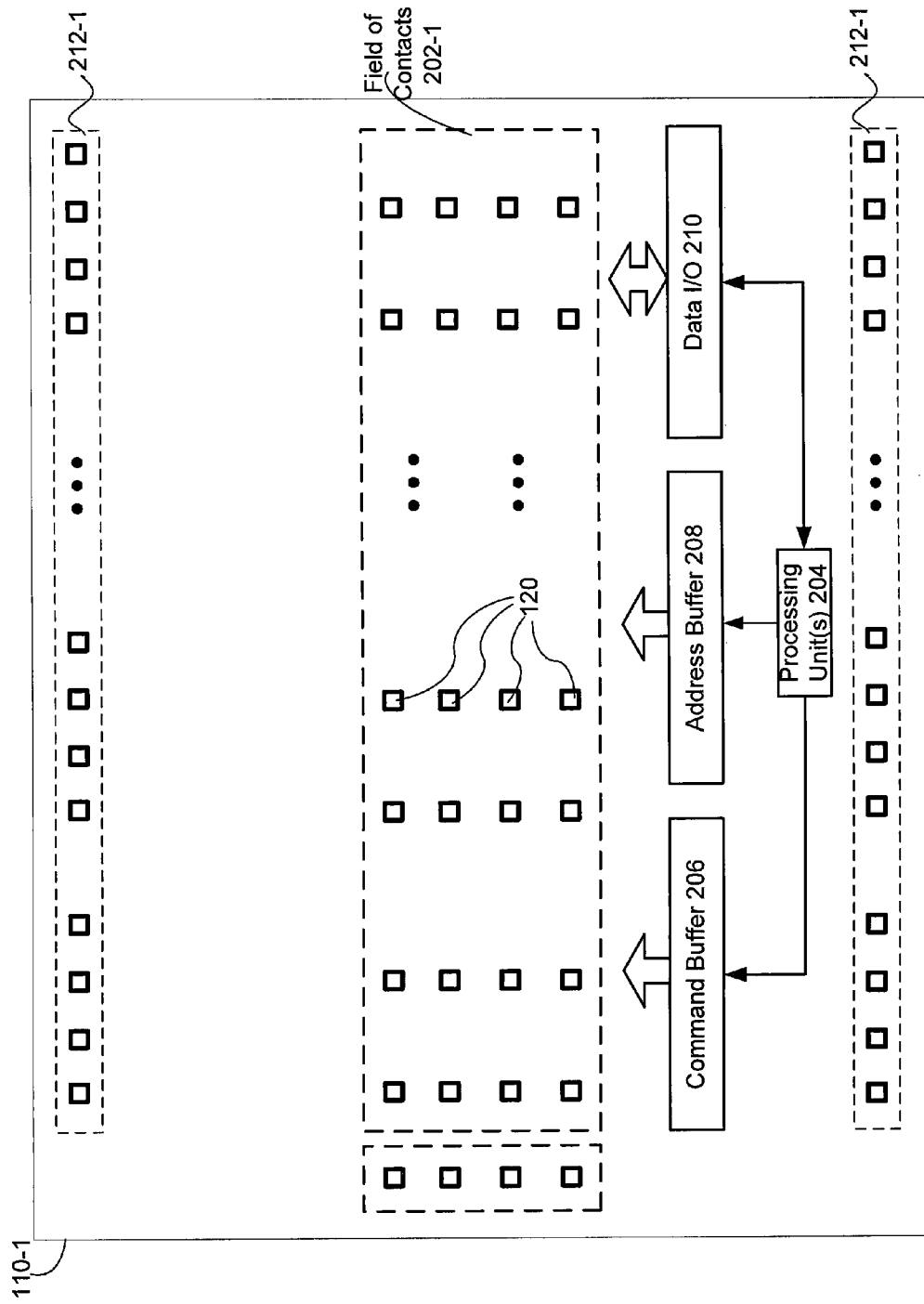
FIG. 2 is a block diagram illustrating a controller die of a multi-die stack that is configured to couple to a field of contacts of the multi-die stack, in accordance with some embodiments.

FIG. 2 is a block diagram illustrating a controller die 110-1 of a multi-die stack that includes a field of contacts 202-1 including a plurality of contacts 120 that are configured to couple to a field of contacts of another die (e.g., a memory die) of the multi-die stack, according to some embodiments. While, in this embodiment, a field of contacts is used to couple controller die 110-1 to the other dies in the multi-die stack, it should be understood that other arrangements of connectors could be used to connect controller die 110-1 to the other dies in the multi-die stack. In some implementations, controller die 110-1 includes one or more processing units 204 (e.g., microprocessors), a command buffer 206, an address buffer 208, and a data input/output (I/O) interface 210. In operation, CPU 204 determines an operation (e.g., read, write, erase, etc.) to be performed on a block of data stored in the memory dies, and sends instructions to the command buffer 206, the address buffer 208 and/or the data I/O interface 210 to perform the operation.

In some embodiments, the command buffer 206 transmits a command (e.g., to the memory block at which the operation is to be performed) indicating the nature of the operation to be performed; the address buffer 208 identifies the data to be operated on within the block of data; and, optionally, the data I/O interface 210 sends data to be written to the block of data (for a write operation) or receives data that was read from the block of data (for a read operation). It should be understood that, when at least part of the block of data is located within a memory bank, sending the command data, and reading/writing the data to the block of data includes identifying the specific memory bank (e.g., using one or more bank address bits) to be electronically selected in order to perform the operation on the identified block of data. In some embodiments, identifying a specific memory bank includes identifying a die of the multi-die stack (e.g., any of memory dies 110-2 to 110-L) that includes the specific memory bank, identifying the specific memory bank within the identified die and, optionally, identifying a rank of the specific memory bank to be selected, as described in greater detail below.

Figure 3:
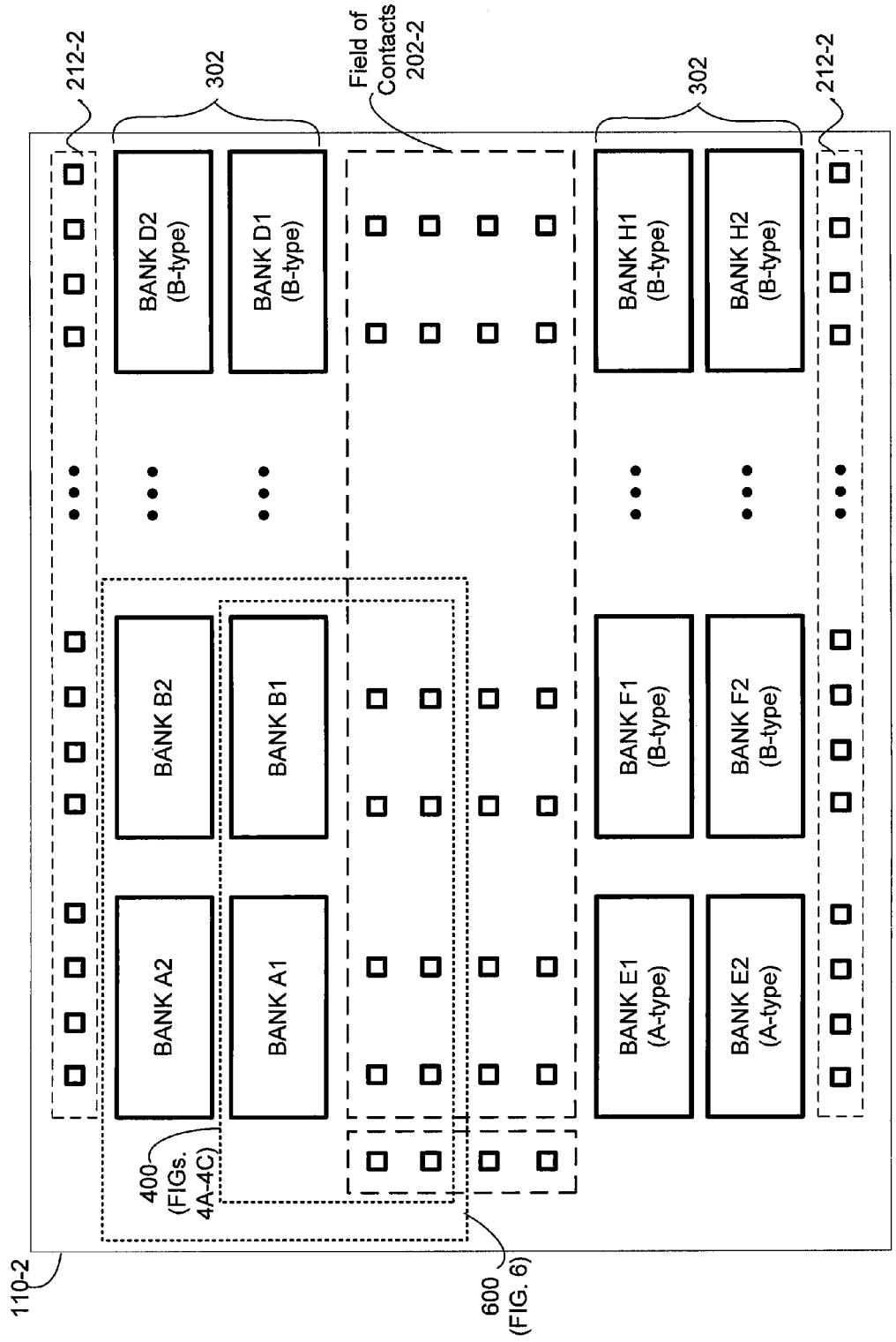
FIG. 3 is a block diagram illustrating an arrangement of memory banks with respect to contacts of a memory die of a multi-die stack, in accordance with some embodiments.

It should be understood that, typically, the most speed-critical signals (e.g., control signals, address signals, data signals, etc.) are routed through a primary field of contacts (e.g., 202-1 in FIG. 2 and 202-2 in FIG. 3), while other non-speed-critical signals (e.g., power, test signals, etc.) may be routed through one or more secondary fields of contacts (e.g., 212-1 in FIG. 2 and 212-1 in FIG. 3). While the primary field of contacts 202 is illustrated as being substantially in the center of the die 110 in FIGS. 2-3, it should be understood that the primary field of contacts 202 may, in principle, be located anywhere on the die, and other components that send or receive speed-critical signals through the field of contacts 202 will typically be placed in close proximity to the primary field of contacts 202.

FIG. 3 is a block diagram illustrating an arrangement of memory banks with respect to contacts of a memory die 110-2 of multi-die stack 100 of FIG. 1, according to some embodiments. In some embodiments, one or more of the memory dies (e.g., 110-2 in FIG. 3), a field of contacts 202-2 is located between two sets of memory banks. As shown in FIG. 3, in these embodiments, a first set of memory banks 302-1 is arranged on a first side of the field of contacts 202-2 (e.g., half of the memory banks 302 including memory banks A-D are above the field of contacts 202-2 in FIG. 3) and a second set of memory banks 302-2 is arranged on a second side of the field of contacts 202-2 that is opposite the first side (e.g., the other half of the memory banks 302 including memory banks E-H are positioned below the field of contacts 202-2 in FIG. 3).

In some embodiments, the first set of memory banks 302-1 and second set of memory banks 302-2 each include numerous memory banks arranged along an edge of the field of contacts 202-2. In some embodiments, the memory banks are grouped (e.g., along the field of contacts), where each group of memory banks shares a set of contacts in the field of contacts. For example, in FIG. 3, memory bank A1 and memory bank B1 are a group 400 of memory banks that share a set of contacts in the field of contacts, as described in greater detail below with reference to FIGS. 4A-4C.

In some embodiments, only a single rank of memory banks is included in each set of memory banks (e.g., if only memory banks A1 through D1 were located above the field of contacts 202-2, and only memory banks E1 through H1 were located below the field of contacts 202-2 in FIG. 3). In these embodiments, the memory banks in a respective set of memory banks are arranged so that each memory bank is proximate to the field of contacts 202-2. In some other embodiments, the memory banks within a set of memory banks (e.g., 302-1) are arranged in a plurality of ranks (e.g., memory banks A1, B1, D1, E1, F1, and H1 are in a first rank, while memory banks A2, B2, D2, E2, F2, and H2 are in the second rank). In embodiments where there are multiple ranks of memory banks, as illustrated in FIG. 3, respective ranks of memory banks may be selected for connection to the contacts in field of contacts 202-2 via multiplexers. For example, in FIG. 3, memory banks A1, A2, B1, and B2 are a group 600 of memory banks that share a set of contacts in the field of contacts and include a plurality of ranks of memory banks, as described in greater detail below with reference to FIG. 6.

While the examples described herein will be described primarily with reference to memory banks A1, A2, B1, and B2, it should be understood that a memory die may include analogous components with analogous functions for additional groups of memory banks. For example, in the embodiment illustrated in FIG. 3, the memory die 110-2 includes additional groups of memory banks (e.g., memory banks E1, E2, F1 and F2) that share different a set of contacts in the field of contacts in an manner that is analogous to the set of contacts shared by memory banks A1, A2, B1 and B2 (e.g., memory bank E1 is analogous to memory bank A1, memory bank F1 is analogous to memory bank B1, memory bank E2 is analogous to memory bank A2, and memory bank F2 is analogous to memory bank B2). Additionally, it should be understood that while, in principle, there could be any number of "A-type" and "B-type" memory banks on the memory die, the number of memory banks on the memory die will be determined based on criteria such as the size of the memory banks and the available space on the memory die.

Additionally, as described above, the contacts in the primary field of contacts 202-2 are typically used for speed-critical signals (e.g., control signals, address signals, data signals, etc.), while the contacts in the secondary field of contacts 212-2 are used for non-speed-critical signals (e.g., power, testing signals, etc.). In some embodiments, power connections to individual dies of multi-die memory stack 110, including one or more of the memory dies (e.g., memory die 110-2), include auxiliary contacts 212-2, preferably on one or both sides of the memory banks 302 away from the primary field of contacts 202-2 (as illustrated in FIG. 3), or in between memory banks (not shown). Optionally, the number of auxiliary contacts depends of the number of memory banks in the respective sets of the memory banks.

Figure 4A:
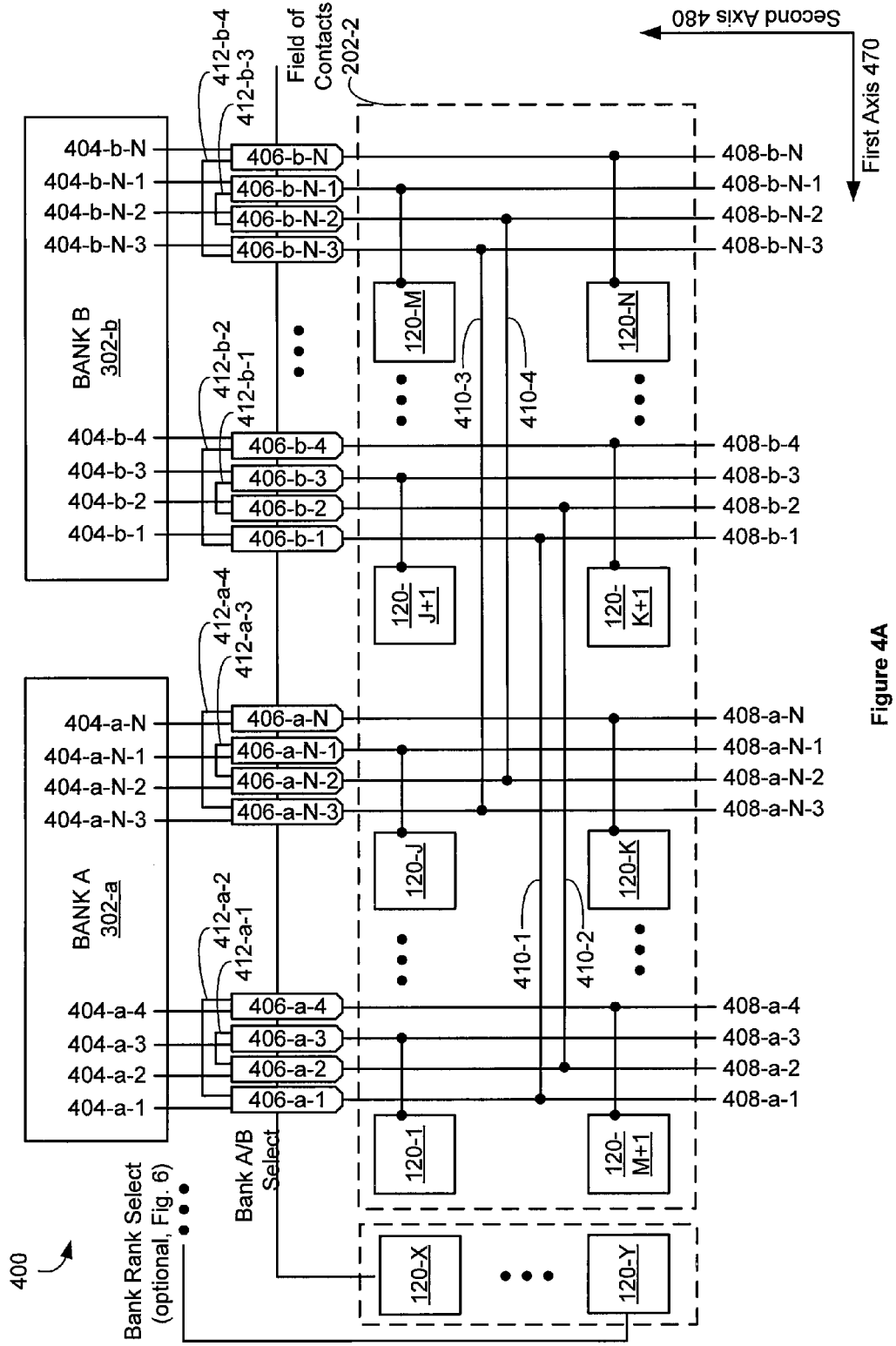
FIG. 4A is a block diagram illustrating an arrangement and wiring of a memory die of a multi-die stack, in accordance with some embodiments.

FIG. 4A is a block diagram illustrating an arrangement and wiring of a memory die 110-2 of multi-die stack 100 of FIG. 1, according to some embodiments. Memory die 110-2 includes a first memory bank 302-a and a second memory bank 302-*b* (e.g., DRAM banks A and B) coupled to respective contacts (e.g., contacts 120-1-120-N) of the field of contacts 202-2 via signal lines 404. In particular, the first memory bank 302-*a* is coupled to contacts in the field of contacts via signal lines 404-*a*-1-404-*a*-N; and the second memory bank 302-*b* is coupled to contacts in the field of contacts via signal lines 404-*b*-1-404-*b*-N. In some embodiments each of the memory banks has a plurality of signal lines (e.g., data lines, address lines and/or control lines for transmitting data, address and/or control signals, respectively). The signal lines 404-*a* corresponding to memory bank A and signal lines 404-*b* corresponding to memory bank B may carry numerous (e.g., more than 256) signals (e.g., 256 data bits, 6 control bits, and 20 address bits) that are to be communicated between memory banks 302-*a* and 302-*b* and other dies of the multi-die memory stack 100 through contacts 120-1-120-N of field of contacts 202-2. The signal lines 404 are ultimately connected to respective contacts 120 in field of contacts 202-2 via one or more respective buffers 406, one or more respective buffer lines 408 and, for some signal lines 404, one or more cross-bar lines 410 and one or more bridge lines 412, as described in more detail below. In some embodiments each of the buffers 406 is coupled between a respective signal line and a respective buffer line. In some embodiments, the cross-bar lines 410 are interleaved with the contacts 120 in the field of contacts 202, as illustrated in FIG. 4A. In some embodiments, the contacts 120 are interleaved between sets of buffer lines 408 as illustrated in FIG. 4A.

Referring to the configuration of field of contacts 202-2, in the exemplary embodiment illustrated in FIG. 4A, the contacts in this field are arranged in a rectangular array. In some embodiments, the rectangular array has a longer side and a shorter side. In some embodiments, the longer side of the rectangular array is adjacent to the memory banks. As shown in FIG. 4A, the array of contacts has two axes, a first axis 470 substantially parallel to the longer side of the rectangle and a second axis 480 substantially perpendicular to first axis 470 (e.g., the angle between the first axis and the second axis is 90±Y degrees, where Y is not more than five degrees). In some embodiments, the cross-bar lines (e.g., cross-bar lines 410-1, 410-2, 410-3 and 410-4) are substantially parallel to first axis 470 and the buffer lines are substantially perpendicular to first axis 470. In other words, in some embodiments, the cross-bar lines are substantially perpendicular to the buffer lines.

One problem typically created by conductive lines on a semiconductor die is that the conductive lines introduce stray capacitance (e.g., unwanted capacitance between two conductive elements) that increases power consumption and limits the operational speed of the semiconductor die when it is in operation. The effect of this stray capacitance increases with the length of the lines. Thus, it is desirable to keep conductive lines in the semiconductor die as short as practical. As such, in some embodiments, the cross-bar lines are interleaved with the contacts in the field of contacts 202-2 and extend no more than half of the width of the field of contacts 202 (in a direction substantially parallel to first axis 470). Moreover, as described in greater detail below, with reference to FIGS. 4B and 4C, in some embodiments the cross-bar lines are used for only half of the signals (e.g., half of the signals are passed to contacts without traveling through any cross-bar line). The fact that cross-bar lines span approximately half of the width of field of contacts 202-2 and that the cross-bar lines are used for only half of the signals (half of the signals are passed to contacts without traveling through any cross-bar line) results in an average line length in the horizontal direction (parallel to first axis 470) of approximately one fourth of the width of the field of contacts. To achieve a similar average line length using an alternative circuit arrangement such as bank switches at the contacts would require twice as many lines resulting in a correspondingly larger area usage. Thus, the reduction in the length of horizontal lines enabled by the configuration illustrated in FIG. 4A will typically result in a substantial reduction in stray capacitance of the memory die, thereby reducing the power draw and improving operational speed of the memory die.

Furthermore, it should be noted that the arrangement of signal lines 404, buffers 406, buffer lines 408, cross-bar lines 410 and bridge lines 412 illustrated in FIG. 4A enables the contacts 120 to be dynamically connected to either memory Bank A 302-*a* or memory Bank B 302-*b* without the placement of any active circuit elements (e.g., buffers, multiplexers, tri-state switches, etc.) within the field of contacts 202-2. Instead, the buffers 406 are positioned in between the memory banks (e.g., memory banks 302-*a* and 302-*b*) and the field of contacts 202-2. It should be understood that avoiding the placement of active circuit elements within the field of contacts 202-2 enables the field of contacts 202-2 to have a finer pitch, as described above. Moreover, placing the buffers between the memory banks 302 and the field of contacts 202-2 reduces the overall length of the lines that implement the circuitry configuration described below, thereby reducing the power draw and increasing the operational speed of the memory die. Embodiments where contacts 120 are capable of being dynamically connected to either memory Bank A 302-*a* or memory Bank B 302-*b* enable the respective contacts 120-1-120-N to serve as contacts for both memory bank A 302-*a* and memory bank B 320-*b*, thereby reducing the number of contacts needed in the field of contacts 202-2.

The buffers 406 are used to determine whether the respective contacts 120-1-120-N that are associated with memory bank A 302-*a* and memory bank B 302-*b* are connected to the signal lines 404-*a* for memory bank A 302-*a* or, alternatively, are connected to the signal lines 404-*b* for memory bank B 302-*b*. In some embodiments, a buffer 406 has two states, a "pass-through" state and a "bridge" state. When the buffer 406 is in a "pass-through" state, the buffer connects the signal line 404 to the buffer line 408. In contrast, when the buffer is in a "bridge" state, the buffer 406 connects the buffer line 408 to a bridge line 412 which is connected to a different buffer which is, in turn, connected to a different buffer line. In some embodiments, the state of a buffer is determined based on a control signal (e.g., a "Bank A/B Select" signal) received through one of the contacts.

Figure 4B:
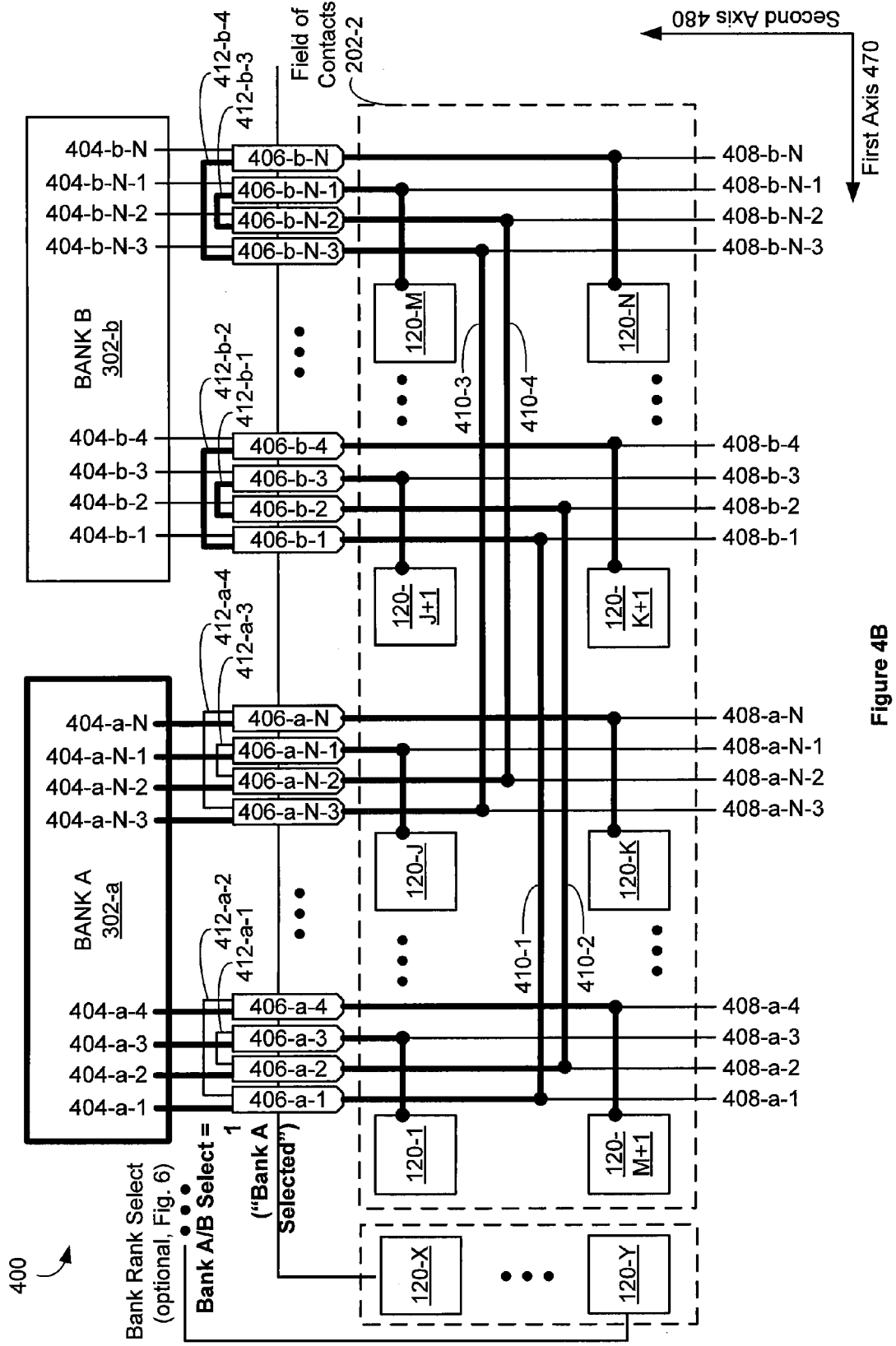
FIGS. 4B and 4C are block diagrams illustrating enabled signal paths in the memory die of FIG. 4A that are enabled during operation of the multi-die stack in accordance with a currently selected memory bank, in accordance with some embodiments.
Figure 4C:
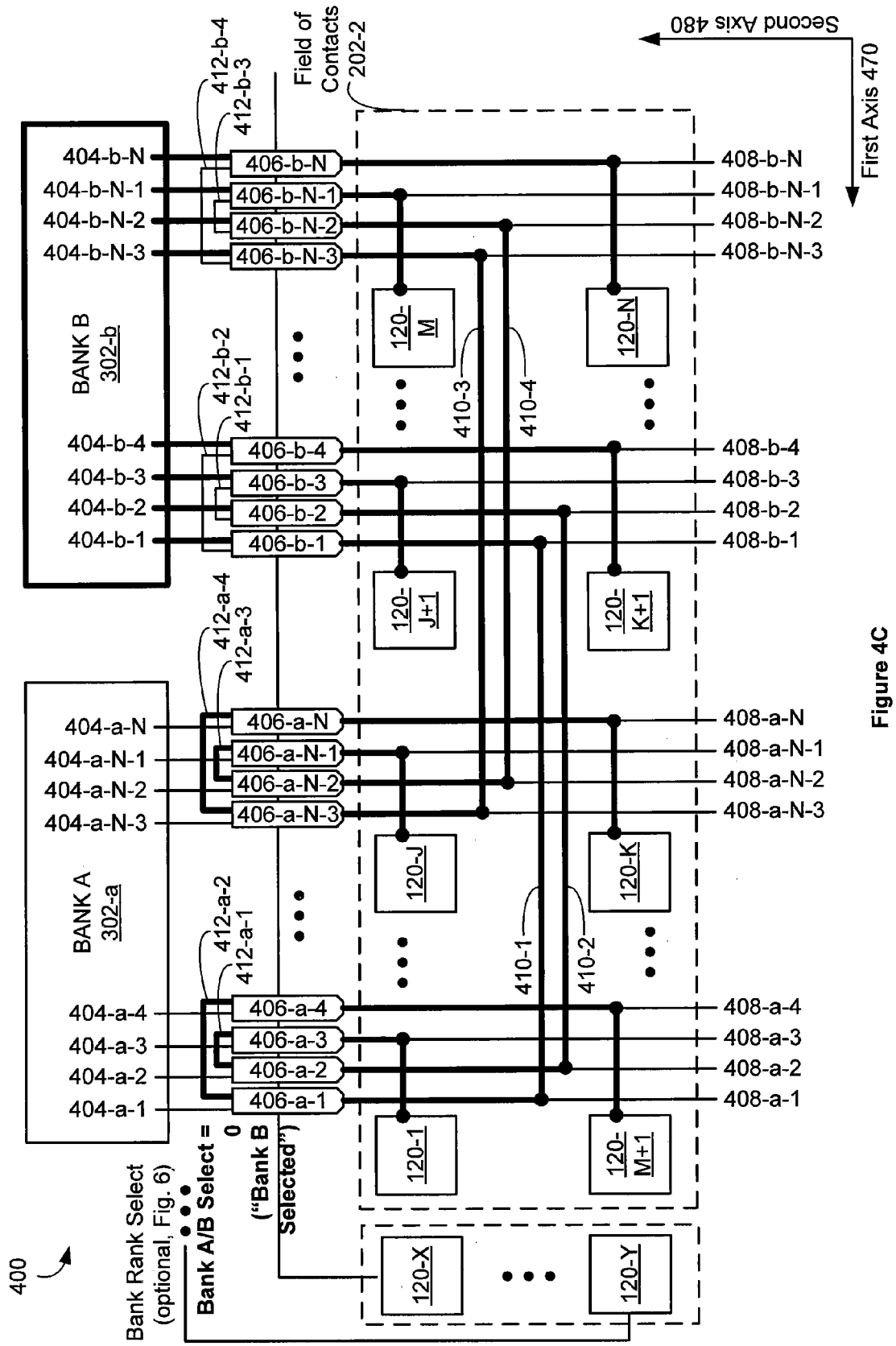

For example, in FIG. 4A, the memory die receives a "Bank A/B select" signal from the controller die (e.g., 110-1 in FIG. 1), which is received by the buffers 406 on the memory die. In some embodiments, the buffers are configured such that: a first state signal (e.g., "Bank A Selected") sets the buffers 406-*a* for memory bank A 302-*a* to the "pass-through" state and sets the buffers 406-*b* for memory bank B 302-*b* to the "bridge" state (e.g., as illustrated in FIG. 4B); and a second state signal (e.g., "Bank B Selected") sets the buffers 406-*a* for memory bank A 302-*a* to the "bridge" state and sets the buffers 406-*b* for memory bank B 302-*b* to the "pass-through" state (e.g., as illustrated in FIG. 4C). Consequently, when the buffer state signal is in the first state (e.g., when memory bank A 302-*a* is selected), the signal lines 404-*a* of memory bank A 302-*a* are coupled to the respective contacts 120-1-120-N (e.g., as illustrated in FIG. 4B), while when the buffer state signal is in the second state (e.g., when memory bank B 302-*b* is selected), the signal lines 404-*b* of memory bank B 302-*b* are coupled to the respective contacts 120-1-120-N (e.g., as illustrated in FIG. 4C).

Additionally, it should be understood that, in some embodiments, two different subsets of buffer lines are used to interconnect the buffers 406 with the respective contacts 120-1-120-N. A first subset of buffer lines (e.g., "direct" buffer lines 408-a-3, 408-a-4, 408-a-N−1, 408-a-N, 408-b-3, 408-b-4, 408-b-N−1, and 408-b-N) are directly connected to contacts (e.g., contacts 120-1, 120-M+1, 120-J, 120-K, 120-J+1, 120-K+1, 120-M, and 120-N, respectively). The second subset of buffer lines (e.g., "indirect" buffer lines 408-a-1, 408-a-2, 408-a-N−3, 408-a-N−2, 408-b-1, 408-b-2, 408-b-N−3, and 408-b-N−2) are indirectly connected to the contacts. In particular, respective buffer lines in the second subset are interconnected to respective similar buffer lines in the second subset via cross-bar lines (e.g., "indirect" buffer lines 408-a-1, 404-b-1 are interconnected via cross-bar line 410-1), and further connected via buffers in the "bridge" state to buffer lines in the first subset of buffer lines (e.g., "direct" buffer lines), that are directly connected to the contacts, as described in greater detail below with reference to FIGS. 4B-4C. In these embodiments, each of the indirect buffer lines can be connected to either of two different contacts of the respective contacts depending on the states of the buffers 406. For example, indirect buffer line 408-a-1 can be connected to either contact 120-M+1 if buffers 406-a-1 and 406-a-4 are in the "bridge" state, or can be connected to contact 120-K+1 if buffers 406-b-1 and 406-b-4 are in the "bridge" state. In some embodiments, the first subset of buffer lines and the second subset of buffer lines each comprise half of the buffer lines.

As discussed in greater detail above, in some embodiments, each of the buffers 406 can be configured in at least two distinct states (e.g., a "pass-through" state or a "bridge" state). In some embodiments, when in a first state, each buffer connects a signal line to a corresponding buffer line. For example, when the buffers 406-a-3 and 406-a-4 are in the first state the signal lines 404-a-3 and 404-a-4 are respectively coupled through buffers 406-a-3 and 406-a-4 and buffer lines 408-a-3 and 408-a-4 to contacts 120-1 and 120-M+1, respectively. In contrast, when in a second state, a respective pair of buffers (along with a bridge line connecting the pair of buffers) connect a respective buffer line in the first subset of buffer lines to a corresponding buffer line in the second subset of buffer lines. For example, when the buffers 406-a-1 and 406-a-4 are in the second state the buffer lines 408-a-1 (belonging to the second subset) and 408-a-4 (belonging to the first subset) are connected to one another via a bridge line 412-a-2. Similarly, when the buffers 406-b-1 and 406-b-4 are in the second state the buffer lines 408-b-1 (belonging to the second subset) and 408-b-4 (belonging to the first subset) are connected to one another via a bridge line 412-b-2.

In some embodiments, the operation of the memory die is such that when one of memory banks (e.g., memory bank 302-a) is selected, a first group of buffers corresponding to that memory bank (e.g., a first half of the buffers including buffers 406-a-1-406-a-N) are in the first state and a second group of buffers (e.g., a second half of the buffers including buffers 406-b-1-406-b-N) corresponding to the other memory bank (e.g., memory bank 302-b) are in the second state. Such a configuration of buffers results in a signal path from the signal lines of memory bank A 302-a to the respective contacts 120-1-120-N in the field of contacts 202-2, as shown in FIG. 4B. It should be understood that, in these embodiments, when the other memory bank is selected, the first group of buffers are in the second state and the second group of buffers are in the first state, and that this configuration of buffers results in a signal path from the signal lines of memory bank B 302-b to the respective contacts 120-1-120-N in the field of contacts 202-2, as shown in FIG. 4C. Consequently, in some embodiments, during a respective operation of the memory die, a first subset of the buffers is configured to be in the first state and a second subset of the buffers is configured to be in the second state, such that every signal line from a currently selected memory bank is coupled to a respective contact in the field. In other embodiments, using additional buffers and/or other circuitry and additional signals to control the state of the buffers, a predefined fraction of the signal lines (e.g., half, a quarter, an eighth, or more generally 1/N) of the signal lines from a currently selected memory bank are coupled to a respective contact in the field at any one time.

Attention is now directed to FIG. 4B, which illustrates enabled signal paths (e.g., the highlighted signal paths indicated by thicker lines) in the memory die of FIG. 4A that are enabled when memory bank A 302-a is the currently selected memory bank. As shown in FIG. 4B, during operation of the memory die (e.g., 110-2 in FIG. 2), a memory bank is selected to be connected to respective contacts 120-1-120-N in the field of contacts. In some embodiments, a "Bank A/B Select" signal (e.g., one or more bank address bits) is received via a contact 120-X, and the "Bank A/B Select" signal is determined based on the memory bank to be selected. In the exemplary embodiment illustrated in FIG. 4B, the "Bank A/B Select" signal is equal to 1, and is detected across all of the buffers 406. (Alternatively, the "Bank A/B Select" signal is delivered to the buffers 406-a coupled to memory bank A 302-a and to the input of an inverter (not shown), and the inverted select signal output by the inverter is delivered to the buffers 406-b coupled to memory bank B 302-b.) As shown in FIG. 4B, the Select signal causes all of the buffers 406-a associated with the selected memory bank (e.g., memory bank A 302-a) to be in the "pass-through" state and all of the buffers 406-b associated with the non-selected memory bank (e.g., memory bank B 302-b) to be in the "bridge" state. Consequently, as shown in FIG. 4B, a first group of the signal lines 404-a of the selected memory bank (e.g., a first half of signal lines such as 404-a-3, 404-a-4, 404-a-N−1, and 404-a-N) are coupled to a first group of contacts (e.g., the contacts located in a portion of field of contacts 202-2 adjacent to the currently selected memory bank 302-a, such as contacts 120-1, 120-M+1, 120-J, and 120-K). In contrast, a second group of the signal lines 404-a of the selected memory bank (e.g., a second half of signal lines such as 404-a-1, 404-a-2, 404-a-N−3, and 404-a-N−2) are coupled to a second group of contacts (e.g., the contacts located in a portion of field of contacts 202-2 adjacent to other memory bank 302-b, such as contacts 120-J+1, 120-K+1, 120-M, and 120-N). It should be noted that, in this example (e.g., while memory bank A 302-a is selected), there are no active signal paths between memory bank B 302-b and any of the contacts 120-1-120-N.

In some embodiments, the first group of signal lines (e.g., 404-a-3, 404-a-4, 404-a-N−1, and 404-a-N) are coupled to respective contacts in the first group of contacts (e.g., 120-1, 120-M+1, 120-J, and 120-K) through a subset (e.g., half) of the buffers of the selected memory bank (e.g., 406-a-3, 406-a-4, 406-a-N−1, and 406-a-N) and some of the first subset of buffer lines that are adjacent to the currently selected memory bank 302-a (e.g., buffer lines 408-a-3, 408-a-4, 408-a-N−1, and 408-a-N). For example, a respective signal line 404-a-3 in the first group of signal lines is directly coupled, through a respective buffer 406-a-3 that is in a "pass-through" state, to a respective buffer line 408-a-3 in the first subset of buffer lines, which is, in turn, directly coupled to a respective contact 120-1 in the first group of contacts.

On the other hand, the second group of signal lines (e.g., 404-a-3, 404-a-4, 404-a-N−1, and 404-a-N) are coupled to respective contacts in the second group of contacts (e.g., 120-J+1, 120-K+1, 120-M, and 120-N) through the cross-bar lines (e.g., 410-1, 410-2, 410-3, and 410-4), three of the buffers (e.g., 406-*a*-1, 406-*b*-1, and 406-*b*-4; 406-*a*-2, 406-*b*-2, and 406-*b*-3; 406-*a*-N−3, 406-*b*-N−3, and 406-*b*-N; or 406-*a*-N−2, 406-*b*-N−2, and 406-*b*-N−1) and three of the buffer lines (e.g., 408-*a*-1, 408-*b*-1, and 408-*b*-4; 408-*a*-2, 408-*b*-2, and 408-*b*-3; 408-*a*-N−3, 408-*b*-N−3, and 408-*b*-N; or 408-*a*-N−2, 408-*b*-N−2, and 408-*b*-N−1). For example, as illustrated in FIG. 4B, the coupling of the signal line 404-*a*-1 (belonging to the second group of signal lines) to the respective contact 120-K+1 (belonging to the second group of contacts) is afforded through buffer 406-*a*-1, buffer line 408-*a*-1, cross-bar line 410-1, buffer line 408-*b*-1, buffer 406-*b*-1 and buffer 406-*b*-4 (which are in the "bridge" state and are thus connected to one another via bridge line 412-*b*-2), and buffer line 408-*b*-4 (which is connected to contact 120-K+1). Thus, in some embodiments, for the currently selected memory bank of the plurality of memory banks, the first subset of the signal lines (e.g., 404-*a*-3, 404-*a*-4, 404-*a*-N−1, and 404-*a*-N) are each connected to a respective contact in the field by a single buffer and a single buffer line in the first subset of the buffer lines, and the second subset of the signal lines e.g., 404-*a*-3, 404-*a*-4, 404-*a*-N−1, and 404-*a*-N) are each connected to a respective contact in the field by a respective cross-bar line, three of the buffers and three of the buffer lines.

Additionally, it should be understood that, in these embodiments, as illustrated in FIG. 4B the first group of the plurality of contacts (e.g., 120-1, 120-J, 120-M+1, 120-K) are located in a portion of the field adjacent to a currently selected memory bank (e.g., memory bank A 302-*a*) and are directly connected to buffer lines that are coupled to signal lines of the selected memory bank, and the second group of the plurality of contacts (e.g., 120-J+1, 120-K, 120-M, 120-N) are located in a portion of the field adjacent to a currently unselected memory bank (e.g., memory bank B 302-*b*) and are indirectly connected via the cross-bar lines 410 to buffer lines 408 that are coupled to signal lines 404 of the selected memory bank (e.g., memory bank A 302-*a*). Additionally, as illustrated in FIG. 4B, the contacts in the field may be arranged in a rectangular array having a first axis 470 and second axis 480 and a first half of the memory banks (e.g., memory bank A 302-*a*) are arranged on a first side (e.g., the left side) of the field and a second half of the memory banks (e.g., memory bank B 302-*b*) are arranged on a second side (e.g., the right side) of the field that is opposite the first side.

Attention is now directed to FIG. 4C, which illustrates enabled signal paths (e.g., the highlighted signal paths indicated by thicker lines) in the memory die of FIG. 4A that are enabled when memory bank B 302-*b* is the currently selected memory bank. As shown in FIG. 4C, during operation of the memory die (e.g., 110-2 in FIG. 2), a memory bank is selected to be connected to respective contacts 120-1-120-N in the field of contacts. In some embodiments, a "Bank A/B Select" signal (e.g., including one or more bank address bits) is received via a contact 120-X, and the "Bank A/B Select" signal is determined based on the memory bank to be selected. In the exemplary embodiment illustrated in FIG. 4C, the "Bank A/B Select" signal is equal to 0, and is detected across all of the buffers 406. (Alternatively, the "Bank A/B Select" signal is delivered to the buffers 406-*a* coupled to memory bank A 302-*a*, and to the input of an inverter (not shown), and the inverted select signal output by the inverter is delivered to the buffers 406-*b* coupled to memory bank B 302-*b*.) As shown in FIG. 4C, the Select signal causes all of the buffers 406-*b* associated with the selected memory bank (e.g., memory bank B 302-*b*) to be in the "pass-through" state and all of the buffers 406-*a* associated with the non-selected memory bank (e.g., memory bank A 302-*a*) to be in the "bridge" state. Consequently, as shown in FIG. 4C, a first group of the signal lines 404-*b* of the selected memory bank B 302-*b* (e.g., a first half of signal lines such as 404-*b*-3, 404-*b*-4, 404-*b*-N−1, and 404-*b*-N) are coupled to a first group of contacts (e.g., the contacts located in a portion of field of contacts 202-2 adjacent to the currently selected memory bank 302-*b*, such as contacts 120-J+1, 120-K+1, 120-M, and 120-N). In contrast, a second group of the signal lines 404-*b* of the selected memory bank B 302-*b* (e.g., a second half of signal lines such as 404-*b*-1, 404-*b*-2, 404-*b*-N−3, and 404-*b*-N−2) are coupled to a second group of contacts (e.g., the contacts located in a portion of field of contacts 202-2 adjacent to the unselected memory bank A 302-*a*, such as contacts 120-1, 120-M+1, 120-J, and 120-K). It should be noted that, in this example (e.g., while memory bank B 302-*b* is selected), there are no active signal paths between memory bank A 302-*a* and any of the contacts 120-1-120-N.

In some embodiments, the first group of signal lines (e.g., 404-*b*-3, 404-*b*-4, 404-*b*-N−1, and 404-*b*-N) are coupled to respective contacts in the first group of contacts (e.g., 120-J+1, 120-K+1, 120-M, and 120-N) through a subset (e.g., half) of the buffers of the selected memory bank (e.g., 406-*b*-3, 406-*b*-4, 406-*b*-N−1, and 406-*b*-N) and some of the first subset of buffer lines that are adjacent to the currently selected memory bank 302-*a* (e.g., buffer lines 408-*b*-3, 408-*b*-4, 408-*b*-N−1, and 408-*b*-N). For example, a respective signal line 404-*b*-3 in the first group of signal lines is directly coupled, through a respective buffer 406-*b*-3 that is in a "pass-through" state, to a respective buffer line 408-*b*-3 in the first subset of buffer lines, which is, in turn, directly coupled to a respective contact 120-J+1 in the first group of contacts.

On the other hand, the second group of signal lines (e.g., 404-*b*-3, 404-*b*-4, 404-*b*-N−1, and 404-*b*-N) are coupled to respective contacts in the second group of contacts (e.g., 120-1, 120-M+1, 120-J, and 120-K) through the cross-bar lines (e.g., 410-1, 410-2, 410-3, and 410-4), three of the buffers (e.g., 406-*b*-1, 406-*a*-1, and 406-*a*-4; 406-*b*-2, 406-*a*-2, and 406-*a*-3; 406-*b*-N−3, 406-*a*-N−3, and 406-*a*-N; or 406-*b*-N−2, 406-*a*-N−2, and 406-*a*-N−1) and three of the buffer lines (e.g., 408-*b*-1, 408-*a*-1, and 408-*a*-4; 408-*b*-2, 408-*a*-2, and 408-*a*-3; 408-*b*-N−3, 408-*a*-N−3, and 408-*a*-N; or 408-*b*-N−2, 408-*a*-N−2, and 408-*a*-N−1). For example, as illustrated in FIG. 4C, the coupling of the signal line 404-*b*-1 (belonging to the second group of signal lines) to the respective contact 120-M+1 (belonging to the second group of contacts) is afforded through buffer 406-*b*-1, buffer line 408-*b*-1, cross-bar line 410-1, buffer line 408-*a*-1, buffer 406-*a*-1 and buffer 406-*a*-4 (which are in the "bridge" state and are thus connected to one another via bridge line 412-*a*-2), and buffer line 408-*a*-4 (which is connected to contact 120-M+1).

While the examples herein are illustrated using eight signal lines 404 per respective memory bank (e.g., 302-*a* or 302-*b*), it should be understood that a respective memory bank may include more or fewer signal lines (e.g., 16, 32, 64, 128, 256, 512, etc. data lines and one or more control and/or address lines) and the memory die may include a corresponding number of buffers (e.g., one per signal line), buffer lines (e.g., one per buffer), cross-bar lines (e.g., one per pair of "indirect" buffer lines), bridge lines (e.g., one per pair of buffers) that are arranged in an analogous manner to the circuit elements illustrated in FIGS. 4A-4C.

Figure 5:
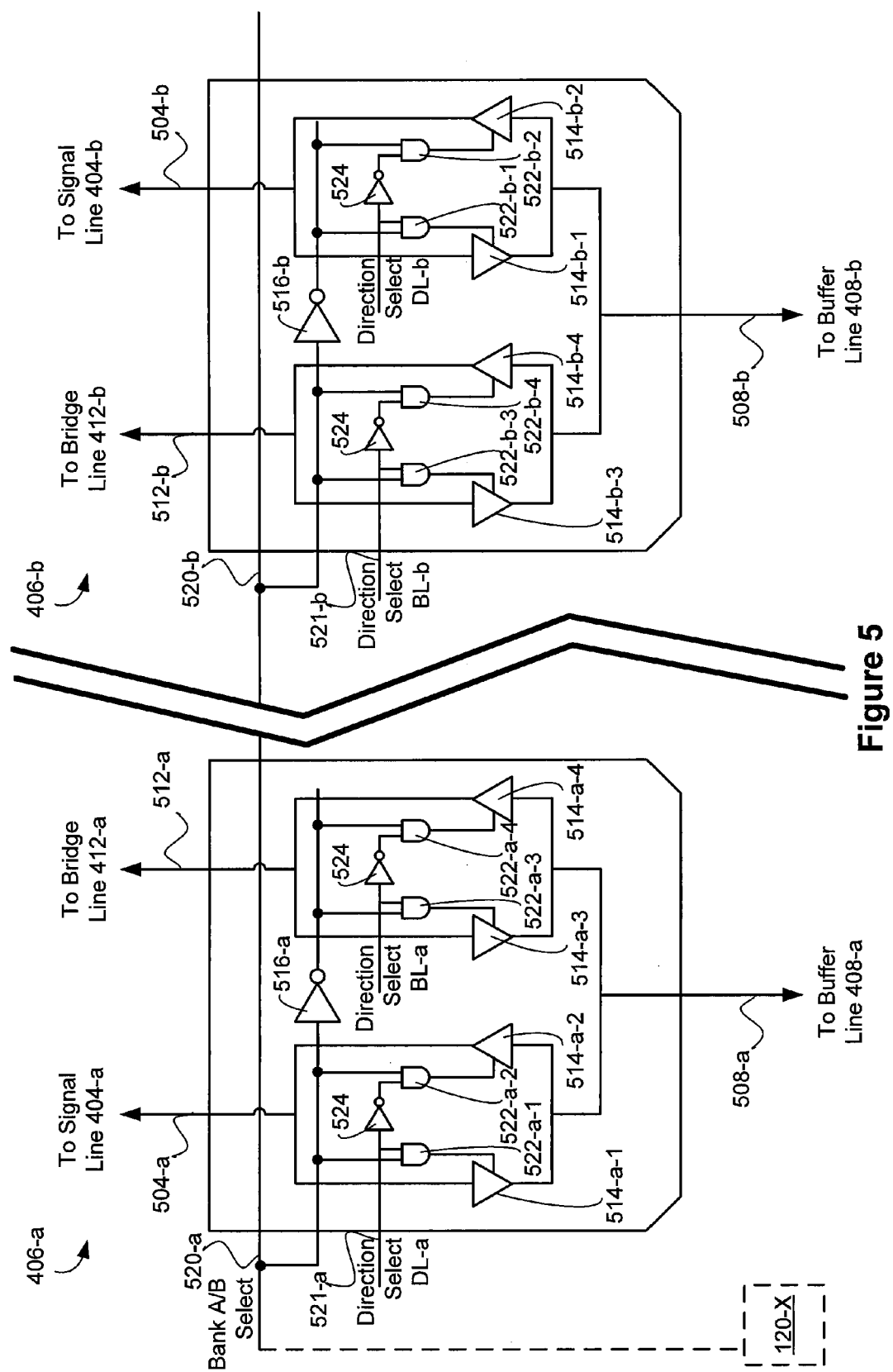
FIG. 5 is a block diagram illustrating internal structure and functionality of a buffer used in coupling memory banks to contacts of the memory die of FIGS. 4A-4C, in accordance with some embodiments.

FIG. 5 is a block diagram illustrating internal structure of a buffer 406 used in coupling memory banks to contacts of the memory die of FIGS. 4A-4C and 6, according to some embodiments. Buffer 406 includes five terminals 504, 508, 512, 520, 521. In accordance with some embodiments, terminal 504 is connected a signal line 404; terminal 508 is connected to a buffer line 408; terminal 512 is connected to a bridge line 412; terminal 520 is connected to a control signal line, which is also a bank select line in the embodiments described here; and terminal 521 is connected to a direction select signal. In some embodiments, the buffers 406 comprise bi-directional switches, each of which is controlled by control signals, including control signals corresponding to one or more bank address bits (e.g., the "Bank A/B Select" control signal, as described in greater detail above). In some embodiments, buffer 406 includes four switches 514 (e.g., tri-state logic elements) which provide a controlled bi-directional signal path between one of terminals 504 or 512 and terminal 508. In other words, the four switches 514 of a respective buffer 406 determine whether: (A) the buffer line 408 is connected to the signal line 404 or (B) the buffer line 408 is connected to the bridge line 412 and the direction of signal transmission that is enabled through the buffer (e.g., signal transmission in the read direction or the write direction).

As described in greater detail above, with respect to FIGS. 4A-4C, buffer 406 can be configured in at least two different operational states (e.g., a "pass-through" state or a "bridge" state) depending on a control signal (e.g., "Bank A/B Select" signal) received by the buffer 406. In some embodiments, the state of buffer 406 is dependent on its association with respect to the selected memory bank. For example, when a memory bank (e.g., memory bank A 302-*a* of FIGS. 4A-4C) is selected, the buffers (e.g., buffers 406-*a*) corresponding to that memory bank are configured in the first state (e.g., the "pass-through" state) and the other buffers (e.g., buffers 406-*b* that are associated with non-selected memory bank B 302-*b*) are configured in the second state (e.g., the "bridge" state).

In some embodiments, when the control signal has a first state (e.g., the "Bank A/B Select" signal=1) a buffer 406-*a* associated with the selected memory bank is in a first state (e.g., a "pass-through" state). In the exemplary buffer architecture illustrated in FIG. 5, the buffer 406-*a* is in the first state because the control signal causes one of the switches (e.g., 514-*a*-1 or 514-*a*-2) connecting the signal line 404-*a* to the buffer line 408-*a* to be closed (e.g., conducting), thereby enabling signals to be conducted between the signal line 404-*a* and the buffer line 408-*a*. In some embodiments, one or more inverters (e.g., 516-*a*) are used to invert the control signal, so that the inverted control signal causes one or more of the switches (e.g., 514-*a*-3 and 514-*a*-4) connecting the bridge line 412-*a* to the buffer line 408-*a* to be open (e.g., non-conducting), thereby disabling signals from being conducted between the bridge line 412-*a* and the buffer line 408-*a*. Typically, the buffer (e.g., 406-*a*) enables either a connection between the signal line 404-*a* and the buffer line 408-*a*, or a connection between the bridge line 412-*a* and the buffer line 408-*a*, but not both. In addition, signals are typically conducted in only one direction, not both.

In some embodiments, when the control signal has a first state (e.g., the "Bank A/B Select" signal=1) and the buffer 406-*a* associated with the selected memory bank is in a first state (e.g., a "pass-through" state), a buffer 406-*b* associated with the non-selected memory bank is in a second state (e.g., a "bridge" state). In the exemplary buffer architecture illustrated in FIG. 5, the buffer 406-*b* is in the second state because the control signal causes one of the switches (e.g., 514-*b*-3 or 514-*b*-4) connecting the bridge line 412-*b* to the buffer line 408-*b* to be closed, (e.g., conducting), thereby enabling signals to be conducted between the bridge line 412-*b* and the buffer line 408-*b* in a direction determined in accordance with a respective Direction Select signal (received via terminal 521-*b*) as needed to perform any particular memory device operation, as described in greater detail below. In some embodiments, one or more inverters (e.g., 516-*b*) are used to invert the control signal, so that the inverted control signal causes the switches (e.g., 514-*b*-1 and 514-*b*-2) connecting the signal line 404-*b* to the buffer line 408-*b* to be open (e.g., non-conducting), thereby disabling signals from being conducted between the signal line 404-*b* and the buffer line 408-*b*. Moreover, when buffer 406-*b* is in the second state (e.g., the "bridging" state), the bridge line 412-*b* connected to terminal 512-*b* provides a path to another buffer that is in the second state (e.g., another buffer that is associated with the non-selected memory bank and is in the "bridge" state) which, in turn provides a connection to another buffer line, as described above with respect to FIGS. 4A-4C. Typically, the buffer enables either a connection between the signal line 404-*b* and the buffer line 408-*b*, or a connection between the bridge line 412-*b* and the buffer line 408-*b*, but not both. Moreover, in accordance with one embodiment the terminals of the buffers are arranged so that buffers (e.g., 406-*a*) associated with a first memory bank (e.g., currently selected memory bank A 302-*a*) are in a first state (e.g., a "pass through" state) when buffers (e.g., 406-*b*) associated with a second memory bank (e.g., currently non-selected memory bank B 302-*b*) are in a second state (e.g., a "bridging" state).

As described above, the enabled signal direction is determined in accordance with a direction select signal (e.g., "Direction Select DL-a," "Direction Select BL-a," "Direction Select BL-b," or "Direction Select DL-b"). The direction select signal is determined based on whether the respective memory bank is sending signals to the contacts (e.g., read data bits) or receiving signals (e.g., control signal, address bits, or write data bits) from the contacts. Additionally, in some embodiments, there are two categories of buffers depending on their connection to the signal lines, and the direction select signal is determined in accordance with both the category of the buffer and the direction of signal transmission for a respective memory device operation. A first category of buffers (i.e., "contact" buffers) includes the buffers (e.g., 406-*a*-3, 406-*a*-4, 406-*a*-N−1, 406-*a*-N, 406-*b*-3, 406-*b*-4, 406-*b*-N−1, and 406-*b*-N in FIG. 4A) that are connected to a contact (e.g., one of contacts 120 in FIG. 4A) without an intervening cross-bar line (e.g., 410 in FIG. 4A). A "contact" buffer may be referred to as being directly connected to a contact. A second category of buffers (i.e., "crossbar" buffers) includes the buffers (e.g., 406-*a*-1, 406-*a*-2, 406-*a*-N−3, 406-*a*-N−2, 406-*b*-1, 406-*b*-2, 406-*b*-N−3, and 406-*b*-N−2 in FIG. 4A) that are connected to a contact via a cross-bar line (e.g., one of cross-bars 410 in FIG. 4A). A "cross-bar" buffer may be referred to as being directly connected to a cross-bar line (e.g., 410 in FIG. 4A).

In some embodiments, the signal path through the buffers is mono-directional. For example, in FIG. 5, each pair of switches 514 is controlled by AND gates 522 that take the Bank A/B Select signal and a Direction Select (e.g., "Direction Select DL-a," "Direction Select BL-a," "Direction Select BL-b," or "Direction Select DL-b") signal as inputs. The Direction Select signal for each pair of switches (e.g., 514-*a*-1 and 514-*a*-2, 514-*a*-3 and 514-*a*-4, 514-*b*-1 and 514-*b*-2, or 514-*b*-3 and 514-*b*-4,)) is inverted by an inverter 524 so that only one of the pair of switches will receive an enable signal from the respective AND gate 522 associated with the switch (e.g., 514-*a*-1 or 514-*a*-2 depending on the control signals). For example, when Direction Select DL-a signal is 1 and Bank A/B Select signal is 1, the AND gate 522-*a*-1 for the first switch 514-*a*-1 will output a 1, and the first switch 514-*a*-1 will be closed, enabling a transmission of signals in the read direction, as illustrated in line 2 of Table 1, below. In contrast, in this example, the AND gate 522-a-2 for the second switch 514-a-2 will output a 0, and the second switch 514-a-2 will be closed, disabling transmission of signals in the write direction. Similarly numbered components in FIG. 5 have analogous functions, which are not repeated here for brevity.

Each category of buffer has four possible configurations due to the combination of read or write direction and signal line 404 or bridge line 412 connection (e.g., whether the buffer is in a "bridging" state or a "pass through" state). Consequently, there are eight possible connection states (e.g., four for "contact" buffers and four for "cross-bar" buffers). The eight possible connection states are illustrated in Table 1, below.

TABLE 1

Exemplary buffer control signals determined based on the category of buffer and chosen signal direction (e.g., read or write).

| Buffer Cat. | Direction | Dir. Sel. | Bank Sel. | Switch | Read | Write |
|---|---|---|---|---|---|---|
| contact | to signal line 404 | 0 | 1 | 514-a-2 | | x |
| contact | from signal line 404 | 1 | 1 | 514-a-1 | x | |
| contact | to bridge line 412 | 0 | 0 | 514-a-4 | | x |
| contact | from bridge line 412 | 1 | 0 | 514-a-3 | x | |
| cross-bar | to signal line 404 | 0 | 1 | 514-a-2 | | x |
| cross-bar | from signal line 404 | 1 | 1 | 514-a-1 | x | |
| cross-bar | to bridge line 412 | 0 | 0 | 514-a-4 | x | |
| cross-bar | from bridge line 412 | 1 | 0 | 514-a-3 | | x |

It should be noted that, for a "contact" buffer the two direction select signals are the same whether the buffer is in read or write mode (e.g., if buffer 406-a in FIG. 5 is a "contact" buffer then the "Direction Select DL-a" signal will have the same value as the "Direction Select BL-a" signal). In contrast, for a "cross-bar" buffer, the two direction signals are in opposite states whether the buffer is in read or write mode (e.g., if buffer 406-a in FIG. 5 is a "cross-bar" buffer then the "Direction Select DL-a" signal will a value that is the inverse of the value of the "Direction Select BL-a" signal). Thus, in some embodiments, each buffer receives only a single direction select signal (via terminal 521-a or 521-b), and the required version (inverted or non-inverted) of the direction select signal is provided to each switch 514 in the buffer.

When the signal lines 404 are data lines, both read and write operations will typically be performed. Thus, all eight connection states shown in Table 1 are typically used when the signal lines 404 are data lines. However, in some embodiments one or more of the signal lines only transmit signals in one direction, and thus only a subset of the eight connect states are needed. For example, for signal lines 404 that are control lines or address lines, only the connection states enabling the write direction (e.g., a transmission direction toward the memory bank) are needed. As another example, for signal lines 404 that are data strobe lines, all eight connection states are used (e.g., data strobes are transmitted in one direction for read operations, and in the opposite direction for write operations). While a data line will typically require the full set of connections and switches described above so as to enable transmission of signals in both the read direction and the write direction, other types of signal lines may require fewer connections and switches. For example, for a command line or address line signals will be transmitted only in the write direction (from the contacts to the memory device), and thus a switch in the downstream direction on the signal line side (e.g., a switch enabling transmission of signals from the signal line to the buffer line, such as 514-a-1 or 514-b-1 in FIG. 5) is not needed. Additionally one or more other switches may not be needed depending on the category of the buffer. For a "contact" buffer used to transmit command line signals or address line signals, a switch in the downstream direction on the bridge line side (e.g., a switch enabling transmission of signals from the bridge line to the buffer line, 514-a-3 or 514-b-3 in FIG. 5) is not needed. Similarly, for a "cross-bar" buffer used to transmit command line signals or address line signals, a switch in the upstream direction on the bridge line side (e.g., a switch enabling transmission of signals from the buffer line to the bridge line, 514-a-4 or 514-b-4 in FIG. 5) is not needed.

In some embodiments, as described in greater detail above, a first group of the plurality of contacts (e.g., "near" contacts) are located in a portion of the field adjacent to a currently selected memory bank and are directly connected to buffer lines that are coupled to signal lines of the selected memory bank, and a second group of the plurality of contacts (e.g., "far" contacts) are located in a portion of the field adjacent to a currently unselected memory bank and are indirectly connected via the cross-bar lines to buffer lines that are coupled to signal lines of the selected memory bank. In some of these embodiments (e.g., when the signal paths are mono-directional for a selected memory bank): write data from a respective near contact will be transmitted to the selected memory bank via a single "contact" buffer that enables transmission of a signal from the contact to the signal line; and write data from respective a far contact will be transmitted to the selected memory bank via a "contact" buffer that enables transmission of a signal from the contact to the bridge line, a first "cross-bar" buffer that enables transmission of the signal from the bridge line to the cross-bar line, and a second "cross-bar" buffer that enables transmission of the signal from the cross-bar line to the signal line. Similarly, in some of these embodiments when the signal paths are mono-directional for a selected memory bank: read data will be transmitted from the selected memory bank to a respective near contact via a single "contact" buffer that enables transmission of a signal from the signal line to the contact; and read data will be transmitted from the selected memory bank to a respective far contact via, a first "cross-bar" buffer that enables transmission of the signal from the signal line to the cross-bar line, a second "cross-bar" buffer that enables transmission of the signal from the cross-bar line to the bridge line, and a "contact" buffer that enables transmission of a signal from the bridge line to the contact.

Additionally, it will be readily understood that, while the signal paths described above with reference to FIG. 5 are described as being mono-directional signal paths or controlled bi-directional signal paths (e.g., signal paths that only enable transmission of signals in one direction at a time), additional control signal lines could be used to independently open or close switches 514 and/or some components could be removed (e.g., AND gates 522) so as to enable a simultaneous bi-directional signal path (e.g., a signal path that simultaneously enables transmission of signals in both the read direction and the write direction at the same time) rather than a mono-directional signal path or a controlled bi-directional signal path.

Figure 6:
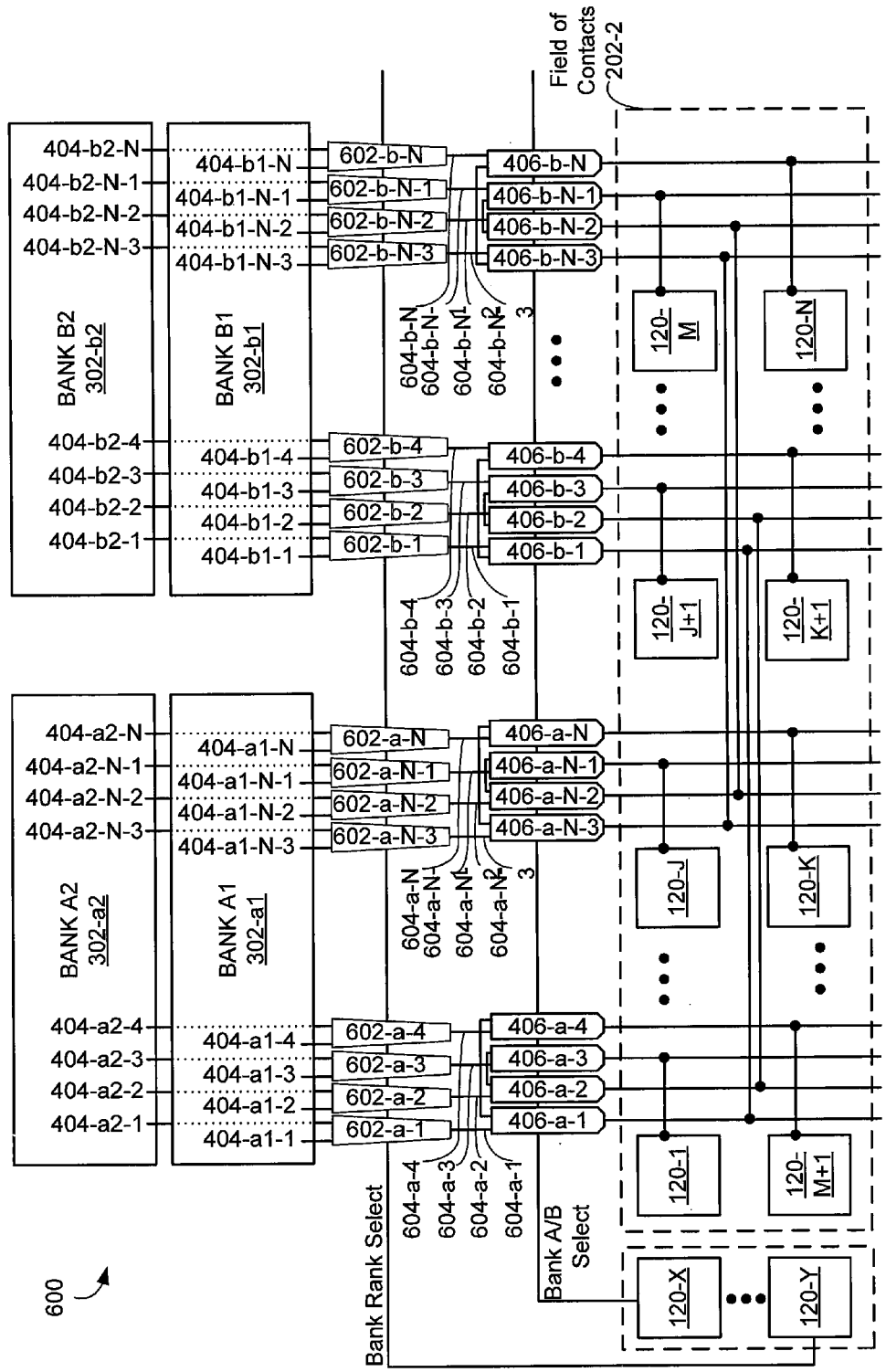
FIG. 6 is a block diagram illustrating an arrangement and wiring of a memory die of a multi-die stack having multiple ranks of memory banks, in accordance with some embodiments.

FIG. 6 is a block diagram illustrating an arrangement and wiring of a memory die of a multi-die stack having multiple ranks of memory banks, according to some embodiments. In some embodiments the memory banks 302 are organized into a plurality of ranks. In some of these embodiments, memory banks (e.g., memory bank A1 302-a1 and memory bank B1 302-b1) in a first rank of memory banks are closer to the field of contacts 202 than memory banks (e.g., memory bank A2 302-*a*2 and memory bank B2 302-*b*2) in a second rank of memory banks.

In some embodiments, a plurality of multiplexers 602 are configured to make a selection between the memory banks of the first rank (e.g., memory bank A1 302-*a*1 and memory bank B1 302-*b*1) and the memory banks of the second rank (e.g., memory bank A2 302-*a*2 and memory bank B2 302-*b*2). In these embodiments, respective multiplexers 602 are coupled to signal lines from a plurality of memory banks that are located in different ranks, and, in response to a control signal (e.g., a "Bank Rank Select" control signal, which may be implemented as one or more bank address bits) the respective multiplexers 602 select one of the signal lines to couple to a corresponding signal line input (e.g., terminal 504 in FIG. 5) of a corresponding buffer. In other words, in embodiments where there are multiple ranks of memory banks, the connector line 604 of a multiplexer 606 (which can be configured to connect the buffer to a plurality of different signal lines from memory banks with different ranks) is used in place of (e.g., substituted for) the signal line (e.g., 404 in FIGS. 4A-4C, 5) that coupled the memory bank to the buffer when only a single rank of memory banks was connected to the buffer.

As one illustrative example, in FIG. 6, when the "Bank Rank Select" signal indicates that the first rank is to be selected (e.g., Bank Rank Select=1), the multiplexers 602 couple the signal lines (e.g., 404-*a*1 and 404-*b*1) for the memory banks in the first rank (e.g., memory bank A1 302-*a*1 and memory bank B1 302-*b*1) to the signal line input terminal (e.g., 504 in FIG. 5) of the buffers 406 via a connector line 604. In this example, the multiplexers 602 in FIG. 6 receive the same "Bank Rank Select" signal. Thus, in this example, the signal lines 404-*a*1 for the memory bank A1 are coupled to the buffers 406-*a* associated with the memory banks A1 and A2; and the signal lines 404-*b*1 for the memory bank B1 are coupled to the buffers 406-*b* associated with the memory banks B1 and B2. As such, the buffers 406 can be used (in conjunction with the "Bank A/B Select" control signal) to couple the selected memory bank to the respective contacts (e.g., by coupling either memory bank A1 or memory bank B1 to the respective contacts 120-1-120-N in the filed of contacts 202-2, as described in greater detail above with reference to FIGS. 4A-4C).

As another illustrative example, in FIG. 6, when the "Bank Rank Select" signal indicates that the second rank is to be selected (e.g., Bank Rank Select=0), the multiplexers 602 couple the signal lines (e.g., 404-*a*2 and 404-*b*2) for the memory banks in the second rank (e.g., memory bank A2 302-*a*2 and memory bank B2 302-*b*2) to the signal line input terminal (e.g., 504 in FIG. 5) of the buffers 406 via a connector line 604. In this example, the multiplexers 602 receive the same "Bank Rank Select" signal. Thus, in this example, the signal lines 404-*a*2 for the memory bank A2 are coupled to the buffers 406-*a* associated with the memory banks A1 and A2; and the signal lines 404-*b*2 for the memory bank B2 are coupled to the buffers 406-*b* associated with the memory banks B1 and B2. As such, the buffers 406 can be used (in conjunction with the "Bank A/B Select" control signal) to couple the selected memory bank to the respective contacts (e.g., by coupling either memory bank A2 or memory bank B2 to the respective contacts 120-1-120-N in the field of contacts 202-2, as described in greater detail above with reference to FIGS. 4A-4C). Table 2, below summarizes exemplary signals (e.g., the values of the bank address bits) required to select respective memory banks in embodiments where there are multiple ranks of memory banks.

TABLE 2

Exemplary memory bank selection results based on "Bank A/B Select" control signal and "Bank Rank Select" control signal.

| Bank A/B Select | Bank Rank Select | Memory Bank Selected |
|---|---|---|
| 1 | 1 | A1 |
| 1 | 0 | A2 |
| 0 | 1 | B1 |
| 0 | 0 | B2 |

While only two ranks of memory banks are illustrated in FIG. 6 and Table 2, it should be understood that, in principle, a memory die can contain more than two ranks of memory banks and multiplexers for switching between the signal lines of any number of ranks of memory banks in accordance with an appropriate "Bank Rank Select" signal (e.g., appropriate bank address bits).

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A memory die for use in a multi-die stack having at least one other die, comprising:
   a plurality of memory banks, each having a plurality of signal lines;
   a plurality of contacts arranged in a field, the contacts configured to interface to the at least one other die of the multi-die stack;
   buffer lines, including a first subset of buffer lines and a second subset of buffer lines, the first subset of buffer lines being connected to respective contacts in the field;
   a plurality of buffers, each buffer of the plurality of buffers having a first terminal coupled to a respective signal line, a second terminal coupled to another buffer of the plurality of buffers, and a third terminal coupled to a respective buffer line; and
   a plurality of cross-bar lines interconnecting respective pairs of buffer lines in the second subset of buffer lines.

2. The memory die of claim 1, wherein the contacts in the field comprise a plurality of through-silicon vias (TSVs), the TSVs configured to interface to the other die of the multi-die stack.

3. The memory die of claim 1, wherein each buffer of the plurality of buffers, when in a first state, connects a respective signal line of the plurality of signal lines to a corresponding buffer line.

4. The memory die of claim 3, wherein each buffer of the plurality of buffers, when in a second state, together with another buffer in the second state, connects a respective buffer line in the first subset to a corresponding buffer line in the second subset.

5. The memory die of claim 4, wherein, during a respective operation of the memory die, a first subset of the buffers is configured to be in the first state and a second subset of the buffers is configured to be in the second state, such that every signal line from a currently selected memory bank is coupled to a respective contact in the field.

6. The memory die of claim 1, wherein for a selected memory bank of the plurality of memory banks, a first subset of the plurality of signal lines from the selected memory bank are each connected to a respective contact in the field by a single buffer and a single buffer line in the first subset of the buffer lines, and a second subset of the plurality of signal lines from the selected memory bank are each connected to a respective contact in the field by a respective cross-bar line, three of the buffers and three of the buffer lines.

7. The memory die of claim 1, wherein the buffers comprise bi-directional switches, each of which is controlled by control signals, including control signals corresponding to one or more bank address bits.

8. The memory die of claim 1, wherein the buffers are positioned between the memory banks and the field of contacts.

9. The memory die of claim 1, wherein the cross-bar lines are substantially perpendicular to the buffer lines.

10. The memory die of claim 1, wherein the contacts in the field are arranged in a rectangular array having first and second axes, the first axis substantially parallel to a longer side of the rectangular array and the second axis substantially perpendicular to the first axis; and wherein the buffer lines run substantially parallel to the second axis and the cross-bar lines run substantially parallel to the first axis.

11. The memory die of claim 10, wherein the field has a width in a direction parallel to the first axis and the cross-bar lines each have a cross-bar length, substantially parallel to the first axis, no greater than half the width of the field.

12. The memory die of any preceding claim, wherein the field has no active circuit elements.

13. The memory die of claim 1, wherein the first subset of buffer lines and the second subset of buffer lines each comprise half of the buffer lines.

14. The memory die of claim 1, wherein the cross-bar lines are interleaved with the contacts in the field.

15. The memory die of claim 1, wherein the contacts are interleaved between sets of the buffer lines.

16. The memory die of claim 1, wherein a first group of the plurality of contacts are located in a portion of the field adjacent to a currently selected memory bank and are directly connected to buffer lines that are coupled to signal lines of the selected memory bank, and a second group of the plurality of contacts are located in a portion of the field adjacent to a currently unselected memory bank and are indirectly connected via the cross-bar lines to buffer lines that are coupled to signal lines of the selected memory bank.

17. The memory die of claim 1, wherein the contacts in the field are arranged in a rectangular array having first and second axes and a first half of the memory banks are arranged on a first side of the field and a second half of the memory banks are arranged on a second side of the field that is opposite the first side.

18. A memory die for use in a multi-die stack having at least one other die, comprising:
    a plurality of memory banks, each memory bank of the plurality of memory banks having a respective plurality of signal lines;
    a plurality of contacts arranged in a field, the plurality of contacts configured to interface to the at least one other die of the multi-die stack; and
    a plurality of buffers, each buffer of the plurality of buffers capable of operating in either a first state or a second state, wherein each buffer operating in the first state has a first conductive path through the buffer and each buffer operating in the second state has a second conductive path through the buffer distinct from the first conductive path;
    wherein the plurality of buffers is capable of being configured to couple each signal line of the respective plurality of signal lines of a first memory bank to a respective contact of the plurality of contacts when a first subset of the plurality of buffers is operating in the first state and a second subset of the plurality of buffers is operating in the second state; and
    wherein the plurality of buffers is further capable of being configured to couple each signal line of the respective plurality of signal lines of a second memory bank to a respective contact of the plurality of contacts when the first subset of the plurality of buffers is operating in the second state and the second subset of the plurality of buffers is operating in the first state.

19. The memory die of claim 18, further comprising buffer lines, wherein a respective buffer is coupled between a respective signal line and a respective buffer line, and wherein, a buffer in the first state connects a respective signal line to a corresponding contact via a single buffer line and two buffers each in the second state together connect two buffer lines such that a corresponding signal line is coupled to a corresponding contact through a set of three buffers.

20. The memory die of claim 18, wherein, when in the first state, the first subset of the plurality of buffers couple a first half of the plurality of signal lines of the selected memory bank to a first half of the contacts of the field, and when in the second state, the second subset of the plurality of buffers couple a second half of the plurality of signal lines of the selected memory bank to a second half of the contacts of the field.

21. The memory die of claim 18, wherein the buffers comprise bi-directional switches, each of which is controlled by control signals, including control signals corresponding to one or more bank address bits.

* * * * *